(12) United States Patent
Chen et al.

(10) Patent No.: US 10,892,849 B2
(45) Date of Patent: Jan. 12, 2021

(54) POLAR CODE CODING METHOD AND APPARATUS

(71) Applicant: Huawei Technologies Co., Ltd., Guangdong (CN)

(72) Inventors: Ying Chen, Hangzhou (CN); Rong Li, Hangzhou (CN); Jun Wang, Hangzhou (CN); Hejia Luo, Hangzhou (CN); Yunfei Qiao, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/291,921

(22) Filed: Mar. 4, 2019

(65) Prior Publication Data
US 2019/0199474 A1    Jun. 27, 2019

Related U.S. Application Data

(63) Continuation of application No. PCT/CN2017/095206, filed on Jul. 31, 2017.

(30) Foreign Application Priority Data

Sep. 5, 2016   (CN) .......................... 2016 1 0802550

(51) Int. Cl.
*H03M 13/00* (2006.01)
*H04L 1/00* (2006.01)
(Continued)

(52) U.S. Cl.
CPC .......... *H04L 1/0057* (2013.01); *H03M 13/13* (2013.01); *H03M 13/353* (2013.01);
(Continued)

(58) Field of Classification Search
CPC .... H04L 1/0057; H04L 1/0009; H03M 13/13; H03M 13/635; H03M 13/353
See application file for complete search history.

(56) References Cited

U.S. PATENT DOCUMENTS

| | | | |
|---|---|---|---|
| 10,333,560 B2 * | 6/2019 | Hui | .................. H04L 1/1819 |
| 2014/0208183 A1 | 7/2014 | Mahdavifar et al. | |

(Continued)

FOREIGN PATENT DOCUMENTS

| | | |
|---|---|---|
| CN | 103684477 A | 3/2014 |
| CN | 103825669 A | 5/2014 |

(Continued)

OTHER PUBLICATIONS

R1-164375 Huawei, HiSilicon,"Evaluation of polar codes for eMBB scenario",3GPP TSG RAN WG1 Meeting #85, Nanjing, China, May 23-27, 2016,total 9 pages.

(Continued)

*Primary Examiner* — Samir W Rizk
(74) *Attorney, Agent, or Firm* — Womble Bond Dickinson (US) LLP

(57) ABSTRACT

A polar code coding method and apparatus are provided. The method includes: determining, based on a target code length corresponding to an information bit sequence, a first mother code length corresponding to the information bit sequence; and performing polar code coding on the information bit sequence based on the first mother code length and mapping relationship information, where the mapping relationship information includes a correspondence between a mother code length and at least one of the following: a transport block size, a construction work point, or a construction sequence. In the method provided in the embodiments of the present invention, polar code coding may be directly performed on the information bit sequence based on at least one of a first transport block size, a first construction work point, or a first construction sequence, so as to reduce coding overheads in a polar code coding process.

20 Claims, 6 Drawing Sheets

(51) Int. Cl.
*H03M 13/13* (2006.01)
*H03M 13/35* (2006.01)
(52) U.S. Cl.
CPC ............ *H03M 13/635* (2013.01); *H04L 1/00* (2013.01); *H04L 1/0009* (2013.01)

(56) References Cited

U.S. PATENT DOCUMENTS

| | | | |
|---|---|---|---|
| 2015/0194987 A1 | 7/2015 | Li et al. | |
| 2016/0013887 A1 | 1/2016 | Shen et al. | |
| 2016/0254876 A1 | 9/2016 | Shen et al. | |
| 2016/0352464 A1 | 12/2016 | Shen et al. | |
| 2019/0268022 A1* | 8/2019 | Xu | H03M 13/13 |
| 2019/0312675 A1* | 10/2019 | Yokomakura | H03M 13/09 |

FOREIGN PATENT DOCUMENTS

| | | |
|---|---|---|
| CN | 104079370 A | 10/2014 |
| CN | 105164959 A | 12/2015 |
| CN | 105684316 A | 6/2016 |
| KR | 2016-0096684 A | 8/2016 |

OTHER PUBLICATIONS

R1-164039 Huawei et al.,"Polar codes—encoding and decoding",3GPP TSG RAN WG1 Meeting #xx,Nanjing, China, May 23-27, 2016, total 7 pages.

R1-165165 MediaTek Inc.,"Discussion on Polar Code Design and Performance",3GPP TSG RAN WG1 Meeting #85bis,Nanjing, China, May 23-27, 2016, total 7 pages.

R1-166773 Samsung,"Discussion on Flexible Polar Codes",3GPP TSG RAN WG1 #86,Gothenbourg, Sweden, Aug. 22-26, 2016, total 4 pages.

R1-166893 LG Electronics,"Polar code design",3GPP TSG RAN WG1 Meeting #86 ,Gothenburg, Sweden Aug. 22-26, 2016, total 4 pages.

R1-16xxxx MCC Support,"Draft Report of 3GPP TSG RAN WG1 #85 v0.1.0 (Nanjing,China, May 23-27, 2016)",3GPP TSG RAN WG1 Meeting #86,Göteborg, Sweden, Aug. 22-26, 2016, total 162 pages.

Erdal Arikan, "Channel Polarization: A Method for Constructing Capacity-Achieving Codes for Symmetric Binary-Input Memoryless Channels", IEEE Transactions on Information Theory, vol. 55, No. 7, Jul. 2009, total 23 pages.

Gabi Sarkis et al.,"Flexible and Low-Complexity Encoding and Decoding of Systematic Polar Codes",IEEE Transactions on Communications, vol. 64, No. 7, Jul. 2016,total 14 pages.

Hoyoung Yoo et al.,"Partially Parallel Encoder Architecture for Long Polar Codes",IEEE Transactions on Circuits and Systems—II: Express Briefs, vol. 62, No. 3, Mar. 2015,total 5 pages.

Panasonic, TBS/MCS indication method for NB-PDSCH/PUSCH. 3GPP TSG RAN WG1 NB-IoT Ad-Hoc Meeting, Sophia Antipolis, France, Mar. 22-24, 2016, R1-161924, 7 pages.

* cited by examiner

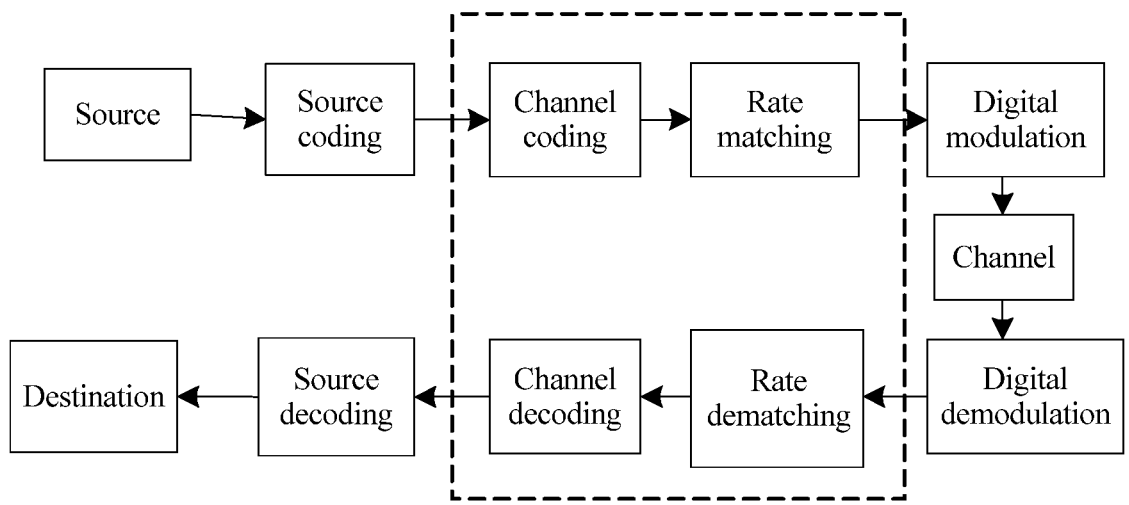

Determine, based on a target code length corresponding to an information bit sequence, a first mother code length corresponding to the information bit sequence — S110

Perform polar code coding on the information bit sequence based on the first mother code length and mapping relationship information, where the mapping relationship information includes a correspondence between a mother code length and at least one of the following: a transport block size, a construction work point, and a construction sequence — S120

FIG. 2

| $N$ $I_{TBS}$ | 64 | 128 | 256 | 512 | 1024 | 2048 | 4096 | 8192 | 16384 | 32768 | 65536 |
|---|---|---|---|---|---|---|---|---|---|---|---|
| 0 | | | | | | | | | | | |
| 1 | | | | | | | | | | | |
| 2 | | | | | | | | | | | |
| 3 | | | | | | | | | | | |
| 4 | | | | | | | | | | | |
| 5 | | | | | | | | | | | |
| 6 | | | | | | | | | | | |
| 7 | | | | | | | | | | | |
| 8 | | | | | | | | | | | |
| 9 | | | | | | | | | | | |
| 10 | | | | | | | | | | | |
| 11 | | | | | | | | | | | |
| 12 | | | | | | | | | | | |
| 13 | | | | | | | | | | | |
| 14 | | | | | | | | | | | |
| 15 | | | | | | | | | | | |
| 16 | | | | | | | | | | | |
| 17 | | | | | | | | | | | |
| 18 | | | | | | | | | | | |
| 19 | | | | | | | | | | | |

| 0 | 0 | 0 | 1 | ... | 1 | 1 | 1 |
|---|---|---|---|---|---|---|---|
| 1 | 2 | 3 | 4 | | 254 | 255 | 256 |

FIG. 3

POLAR CODE CODING METHOD AND APPARATUS

CROSS-REFERENCE TO RELATED APPLICATIONS

This application is a continuation application of International Application No. PCT/CN2017/095206, filed on Jul. 31, 2017, which claims priority to Chinese Patent Application No. 201610802550.4, filed on Sep. 5, 2016. The disclosures of the aforementioned applications are hereby incorporated by reference in their entireties.

TECHNICAL FIELD

Embodiments of the present invention relate to the communications field, and more specifically, to a polar code coding method and apparatus.

BACKGROUND

Channel coding is usually performed in a communications system to improve data transmission reliability and ensure communication quality. A polar code is theoretically proved to be a coding scheme that can achieve a Shannon capacity and has low encoding and decoding complexity. The polar code is a linear block code, a generator matrix of the polar code is $G_N$, and a coding process of the polar code is $x_1^N = u_1^N G_N$, where $x_1^N$ is polar mother code whose length is N, and is a binary row vector, and an element of the row vector is a mother code word; $u_1^N = (u_1, u_2, K, u_N)$ is a binary row vector whose length is N (namely, a code length); and $G_N$ is a N×N matrix, $G_N = B_N F_2^{\otimes(log_2(N))}$, a code length is $N=2^n$, and $n \geq 1$.

$$F_2 = \begin{bmatrix} 1 & 0 \\ 1 & 1 \end{bmatrix},$$

and $B_N$ is a N×N transposed matrix, such as a bit reversal (bit reversal) matrix. $F_2^{\otimes(log_2(N))}$ is defined as a Kronecker product of $log_2 N$ matrices $F_2$, and is defined as $F_2^{\otimes(log_2(N))} = F \otimes F_2^{\otimes(log_2(N))-1)}$.

The foregoing addition and multiplication operations are all addition and multiplication operations in a binary Galois field. In the coding process of the polar code, some bits in $u_1^N$ are used to carry information and are referred to as information bits, and a set of indexes of these bits is denoted by A; other bits are set as fixed values predetermined by a transmit end and a receive end and are referred to as fixed bits, and a set of indexes of these bits is denoted by a complementary set $A^c$ of A. The information bit sequence number set A is selected according to the following method: A polar channel error probability $P_e^{(i)}$ corresponding to a bit with a sequence number i may be obtained by using a construction method such as density evolution or Gaussian approximation, and K sequence numbers with a minimum $P_e^{(i)}$ value are selected to form the set A.

Currently, transport block (TB) sizes are graded into a plurality of levels in a case of different resource quantities in a transport block size (TBS) table of turbo code applied to Long Term Evolution (LTE for short), and a specific value of a TB is related to a transport block size index.

However, in the coding process of the polar code, a feature of polar code coding is to calculate a polar channel error probability by using a construction algorithm. For the polar code, if a TBS table of the polar code is also designed based on the turbo TBS table, different code lengths and code rates correspond to different construction sequences. To be specific, each TBS determined by a resource quantity and the transport block size index corresponds to a construction sequence, thereby causing very large coding overheads.

SUMMARY

Embodiments of the present invention provide a polar code coding method and apparatus, to reduce coding overheads.

According to a first aspect, a polar code coding method is provided, where the method includes: determining, based on a target code length corresponding to an information bit sequence, a first mother code length corresponding to the information bit sequence; and performing polar code coding on the information bit sequence based on the first mother code length and mapping relationship information, where the mapping relationship information includes a correspondence between a mother code length and at least one of the following: a transport block size, a construction work point, or a construction sequence.

In this embodiment of the present invention, a communications device may directly perform polar code coding on the information bit sequence based on at least one of a first transport block size corresponding to the information bit sequence, a first construction work point corresponding to the information bit sequence, or a first construction sequence corresponding to the information bit sequence that are determined based on a mother code length of a polar code, so as to effectively reduce coding overheads in a polar code coding process.

With reference to the first aspect, in one embodiment, the mapping relationship information includes a correspondence between the mother code length and the transport block size; and the performing polar code coding on the information bit sequence based on the first mother code length and mapping relationship information includes: determining, based on the first mother code length and the mapping relationship information, the first transport block size corresponding to the information bit sequence; and performing polar code coding on the information bit sequence based on the first transport block size.

According to the polar code coding method in this embodiment of the present invention, polar code coding is performed on the information bit sequence by using the first transport block size that is corresponding to the information bit sequence and that is determined based on a mother code length of a polar code, so as to effectively reduce the coding overheads in the polar code coding process.

In one embodiment, the mapping relationship information includes a correspondence among a transport block size index, the mother code length, and the transport block size.

In one embodiment, the mapping relationship information includes some or all of the following information:

| $I_{TBs}$ | \multicolumn{11}{c}{N} |
|---|---|---|---|---|---|---|---|---|---|---|---|
| | 64 | 128 | 256 | 512 | 1024 | 2048 | 4096 | 8192 | 16384 | 32768 | 65536 |
| 0 | 16 | 20 | 20 | 42 | 82 | 170 | 340 | 600 | 1300 | 4000 | 5500 |
| 1 | 18 | 24 | 26 | 66 | 136 | 200 | 528 | 902 | 2000 | 5000 | 8000 |
| 2 | 19 | 28 | 34 | 84 | 192 | 294 | 715 | 1000 | 2750 | 6000 | 11000 |
| 3 | 20 | 32 | 40 | 100 | 200 | 400 | 900 | 1338 | 3500 | 8000 | 14000 |
| 4 | 22 | 36 | 48 | 130 | 246 | 512 | 1000 | 1774 | 4250 | 9000 | 17000 |
| 5 | 23 | 40 | 56 | 158 | 300 | 600 | 1284 | 2000 | 5000 | 10500 | 20000 |
| 6 | 24 | 46 | 70 | 182 | 354 | 650 | 1460 | 2212 | 5750 | 12000 | 23000 |
| 7 | 26 | 52 | 80 | 206 | 400 | 730 | 1650 | 2648 | 6500 | 13500 | 26000 |
| 8 | 27 | 56 | 90 | 228 | 458 | 840 | 1830 | 3086 | 7250 | 15000 | 29000 |
| 9 | 28 | 60 | 100 | 252 | 504 | 948 | 2000 | 3522 | 8000 | 16500 | 32000 |
| 10 | 30 | 64 | 112 | 276 | 552 | 1000 | 2200 | 3960 | 8750 | 18000 | 35000 |
| 11 | 31 | 70 | 124 | 298 | 598 | 1058 | 2376 | 4000 | 9500 | 19500 | 38000 |
| 12 | 32 | 76 | 138 | 322 | 644 | 1168 | 2594 | 4396 | 10250 | 21000 | 41000 |
| 13 | 34 | 84 | 150 | 346 | 692 | 1276 | 2770 | 4834 | 11000 | 22500 | 44000 |
| 14 | 36 | 92 | 160 | 368 | 738 | 1386 | 2950 | 5270 | 11750 | 24000 | 47000 |
| 15 | 38 | 100 | 172 | 392 | 786 | 1495 | 3140 | 5708 | 12500 | 25500 | 50000 |
| 16 | | | 180 | 416 | 832 | 1604 | 3330 | 6000 | 13250 | 27000 | 53000 |
| 17 | | | 192 | 438 | 880 | 1714 | 3500 | 6550 | 14000 | 28500 | 56000 |
| 18 | | | 206 | 460 | 928 | 1822 | 3686 | 7100 | 14750 | 30000 | 59000 |
| 19 | | | 220 | 480 | 972 | 1940 | 3890 | 7650 | 15500 | 31000 | 62000 | where N is the mother code length, $I_{TBS}$ is the transport block size index, and a value corresponding to a combination of $I_{TBS}$ and N is the transport block size TBS.

In one embodiment, the mapping relationship information includes a correspondence between the mother code length and the construction work point; and the performing polar code coding on the information bit sequence based on the first mother code length and mapping relationship information includes: determining, based on the first mother code length and the mapping relationship information, the first construction work point corresponding to the information bit sequence; and performing polar code coding on the information bit sequence based on the first construction work point.

According to the polar code coding method in this embodiment of the present invention, polar code coding is performed on the information bit sequence by using the first construction work point that is corresponding to the information bit sequence and that is determined based on a mother code length of a polar code, so as to effectively reduce the coding overheads in the polar code coding process.

In one embodiment, the mapping relationship information includes a correspondence among a transport block size index, the mother code length, and the construction work point.

In one embodiment, the mapping relationship information includes some or all of the following information:

| $I_{TBs}$ | \multicolumn{10}{c}{N} |
|---|---|---|---|---|---|---|---|---|---|---|
| | 64 | CSNR | 128 | CSNR | 256 | CSNR | 512 | CSNR | 1024 | CSNR |
| 0 | 16 | 5.377 | 20 | 4.1389 | 20 | 3.6549 | 42 | 2.1699 | 82 | 1.3 |
| 1 | 18 | 5.2084 | 24 | 3.7259 | 26 | 3.2263 | 66 | 1.655 | 136 | 0.9863 |
| 2 | 19 | 5.1599 | 28 | 3.5123 | 34 | 2.7537 | 84 | 1.4834 | 192 | 0.8907 |
| 3 | 20 | 5.0827 | 32 | 3.3621 | 40 | 2.5648 | 100 | 1.4187 | 200 | 0.8897 |
| 4 | 22 | 5.044 | 36 | 3.3061 | 48 | 2.3311 | 130 | 1.3581 | 246 | 0.9346 |
| 5 | 23 | 5.0141 | 40 | 3.2353 | 56 | 2.2119 | 158 | 1.4122 | 300 | 1.001 |
| 6 | 24 | 5.0105 | 46 | 3.1878 | 70 | 2.0803 | 182 | 1.4798 | 354 | 1.078 |
| 7 | 26 | 5.0403 | 52 | 3.1738 | 80 | 2.1721 | 206 | 1.5917 | 400 | 1.1982 |
| 8 | 27 | 5.0689 | 56 | 3.2737 | 90 | 2.1345 | 228 | 1.6957 | 458 | 1.3188 |
| 9 | 28 | 5.086 | 60 | 3.2907 | 100 | 2.1734 | 252 | 1.8289 | 504 | 1.4884 |
| 10 | 30 | 5.1849 | 64 | 3.3993 | 112 | 2.2503 | 276 | 1.971 | 552 | 1.6786 |
| 11 | 31 | 5.2379 | 70 | 3.507 | 124 | 2.3663 | 298 | 2.1607 | 598 | 1.8632 |
| 12 | 32 | 5.2484 | 76 | 3.7313 | 138 | 2.4826 | 322 | 2.3611 | 644 | 2.0591 |
| 13 | 34 | 5.4304 | 84 | 4.079 | 150 | 2.7023 | 346 | 2.6133 | 692 | 2.2783 |
| 14 | 36 | 5.6668 | 92 | 4.609 | 160 | 2.8891 | 368 | 2.8582 | 738 | 2.5767 |
| 15 | 38 | 5.9165 | 100 | 5.4303 | 172 | 3.1032 | 392 | 3.2032 | 786 | 2.8966 |
| 16 | | | | | 180 | 3.2855 | 416 | 3.5998 | 832 | 3.2643 |
| 17 | | | | | 192 | 3.6439 | 438 | 4.0839 | 880 | 3.7595 |
| 18 | | | | | 206 | 4.1581 | 460 | 4.7734 | 928 | 4.4459 |
| 19 | | | | | 220 | 5.0084 | 480 | 5.8749 | 972 | 5.4819 | where N is the mother code length, $I_{TBS}$ is the transport block size index, the channel signal-to-noise ratio CSNR indicates the construction work point, and a value corresponding to a combination of $I_{TBS}$ and N is the transport block size TBS.

In one embodiment, the mapping relationship information includes a correspondence between the mother code length and the construction sequence; and the performing polar code coding on the information bit sequence based on the first mother code length and mapping relationship information includes: determining, based on the first mother code length and the mapping relationship information, the first construction sequence corresponding to the information bit sequence, where the first construction sequence is used to indicate a location of an information bit and/or a location of a fixed bit during coding of the information bit sequence; and performing polar code coding on the information bit sequence based on the first construction sequence.

According to the polar code coding method in this embodiment of the present invention, polar code coding is performed on the information bit sequence by using the first construction sequence that is corresponding to the information bit sequence and that is determined based on a mother code length of a polar code, so as to effectively reduce the coding overheads in the polar code coding process.

In one embodiment, the mapping relationship information includes a correspondence among a transport block size index, the mother code length, and the construction sequence.

In one embodiment, the construction sequence in the mapping relationship information includes a first value and a second value, the first value is used to indicate the location of the information bit, and the second value is used to indicate the location of the fixed bit.

In one embodiment, the first value is "1", and the second value is "0".

In one embodiment, the construction sequence in the mapping relationship information includes a location sequence number arranged based on a priority.

In one embodiment, when in a case of a same mother code length, there is an inclusion relationship between locations that are of transmission information bits and that are corresponding to a plurality of transport block size indexes, the plurality of transport block size indexes correspond to a same construction sequence.

In one embodiment, the determining, based on a target code length corresponding to an information bit sequence, a first mother code length corresponding to the information bit sequence includes: determining the first mother code length according to the following formula:

$$N=2^{\mathrm{floor}[log2(L-1)]+1}, \text{ where}$$

N is the first mother code length, L is the target code length, and floor[ ] indicates rounding down.

In one embodiment, the method further includes: performing rate matching on a coded sequence based on the target code length, to obtain a target code sequence.

In one embodiment, the method further includes: determining, based on a value of a resource quantity corresponding to the information bit sequence, the target code length corresponding to the information bit sequence.

In one embodiment, the mapping relationship information includes a correspondence among a code rate, the mother code length, and the transport block size.

In one embodiment, the mapping relationship information includes a correspondence among a code rate, the mother code length, and the construction work point.

In one embodiment, the mapping relationship information includes a correspondence among a code rate, the mother code length, and the construction sequence.

In one embodiment, the method in the first aspect may be performed by a network device, or may be performed by a terminal device.

According to a second aspect, a polar code coding apparatus is provided. The apparatus includes modules configured to perform the method in the first aspect. Based on a same inventive concept, a problem-resolving principle of the apparatus corresponds to the solution of the method design of the first aspect. Therefore, for implementation of the apparatus, refer to implementation of the method, and no repeated description is provided. The apparatus may be a network device, or may be a terminal device.

According to a third aspect, a polar code coding apparatus is provided. The apparatus includes a processor, a memory, and a transceiver. The memory is configured to store a program and mapping relationship information. The processor is configured to execute the program. The transceiver is configured to communicate with another device. When the program is executed, the processor is configured to perform the method in the first aspect. The apparatus may be a terminal device, or may be a network device.

BRIEF DESCRIPTION OF DRAWINGS

FIG. 1 is a schematic flowchart of locations of channel coding and rate matching in a communication link according to an embodiment of the present invention;

FIG. 2 is a schematic flowchart of a polar code coding method according to an embodiment of the present invention;

FIG. 3 is a schematic diagram of a construction sequence of polar code coding according to an embodiment of the present invention;

DESCRIPTION OF EMBODIMENTS

Figure 4:
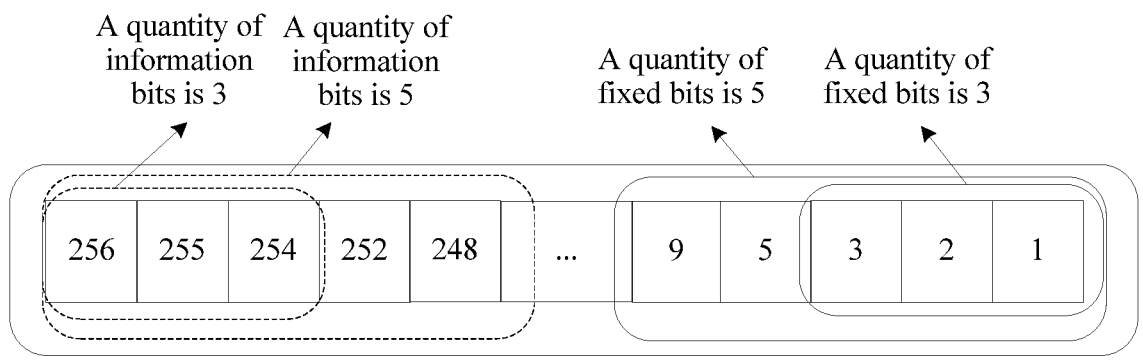
FIG. 4 is a schematic diagram of a construction sequence of polar code coding according to another embodiment of the present invention.

It should be understood that a 5G communications system is used as an example for description in embodiments of the present invention, but the embodiments of the present invention are not limited thereto. To be specific, the technical solutions in the embodiments of the present invention may be applied to various communications systems, for example, a Global System for Mobile Communications (GSM), a Code Division Multiple Access (CDMA) system, a Wideband Code Division Multiple Access (WCDMA) system, a general packet radio service (GPRS), a Long Term Evolution (LTE) system, an LTE frequency division duplex (FDD) system, an LTE time division duplex (TDD) system, and a Universal Mobile Telecommunications System (MTS).

The technical solutions in the embodiments of the present invention mainly relate to a channel coding technology. FIG. 1 shows locations of channel coding and rate matching in a communication link. As shown in FIG. 1, when a communications device needs to send information, the communications device first needs to perform source coding on a source, then performs channel coding and rate matching on a sequence obtained after the source coding, to obtain a target code sequence, performs digital modulation on the target code sequence, and finally sends a modulated sequence.

It should be understood that the communications device in the foregoing process may be a network device or a terminal device, or may be any device that performs channel coding, for example, polar code coding. It should be further understood that a network device or a terminal device that uses conventional turbo code and low-density parity-check code (LDPC) coding to process information or data may also use the polar code coding in this embodiment.

It should be further understood that the network device may be a device configured to communicate with the terminal device. The network device may include a base station or a network side device having a base station function. In particular, for D2D (full name: Device-to-Device) communication, the network device may also be a terminal that functions as a base station. For example, the network device may be a base transceiver station (BTS) in a GSM system or CDMA, or may be a NodeB (NB) in a WCDMA system, or may be an evolved NodeB (eNB or eNodeB) in an LTE system, or the network device may be a relay station, an access point, an in-vehicle device, a wearable device, a network side device in a future 5G network, and the like.

It should be further understood that the terminal device may communicate with one or more core networks by using a radio access network (RAN). The terminal device may be user equipment (UE), an access terminal, a subscriber unit, a subscriber station, a mobile terminal, a mobile station, a remote station, a remote terminal, a mobile device, a user terminal, a wireless communications device, a user agent, or a user apparatus. The access terminal may be a cellular phone, a cordless telephone set, a Session Initiation Protocol (SIP) phone, a wireless local loop (WLL) station, a personal digital assistant (PDA), a handheld device having a wireless communication function, a computing device or another processing device connected to a wireless modem, an in-vehicle device, a wearable device, a terminal device in a future 5G network, and the like.

A polar code is a first and currently known unique channel coding method that can be strictly proved to "achieve" a channel capacity. In a case of different code lengths, particularly for finite code, performance of the polar code is far better than that of turbo code and LDPC code. In addition, the polar code has relatively low computational complexity in encoding and decoding. The polar code has great development and application prospects in 5G due to these advantages. In one embodiment, the polar code is channel dependent code. The polar code performs polar code polarization processing on N identical channels W, to obtain N polar channels. Certainly, Bhattacharyya parameters of the N polar channels either approach 0 or approach 1. In actual application of the polar codes code, an important operation is to calculate reliability of all the $N=2^n$ polar channels for the different channels W, and then select K polar channels with relatively high reliability. A set of location index numbers corresponding to these polar channels is referred to as an information set. During polar code coding, K information symbols are placed in locations corresponding to the information set, and fixed known symbols are placed in remaining (N−K) locations (referred to as a frozen set). Generally, the (N−K) fixed known symbols may be all 0 symbols, where K≤N.

It can be learned from a polar code coding principle that a feature of the polar code coding is to calculate a polar channel error probability by using a construction algorithm. Considering that the polar channel error probability usually depends on a parameter such as a quantity of information bits and a code length, there is a correspondence among a corresponding information set, and the quantity of information bits and the code length.

In a case of different resource quantities, TB sizes are graded into a plurality of levels in a TBS table of LTE turbo, and a specific value of a TB is related to an internal interleaver of a turbo coder.

For the polar code, if a TBS table of the polar code is also designed based on the TBS table of the turbo, different code lengths and code rates correspond to different construction sequences. To be specific, each TBS determined by a resource quantity and a transport block size index corresponds to a construction sequence, thereby causing very large coding overheads, and this cannot be applied in practice. Therefore, the TBS table used for the turbo code in existing LTE is not applicable to the polar code due to these features of the polar code.

In this embodiment of the present invention, mapping relationship information (for example, Table 1 and Table 2) used in the polar code coding is designed based on a mother code length of a polar code, to reduce coding overheads.

FIG. 2 is a schematic flowchart of a polar code coding method 100 according to an embodiment of the present invention. The method 100 may be performed by a communications device such as a network device or a terminal device. The following uses the communications device as an example for description.

Operation S110. Determine, based on a target code length corresponding to an information bit sequence, a first mother code length corresponding to the information bit sequence.

In one embodiment, a mother code length after polar code coding is 2 raised to the power of a positive integer. If a polar code with any code length needs to be obtained, rate matching needs to be performed on mother code. Therefore, the polar code may be constructed based on a mother code length, and does not need to be constructed based on an actual code length (a target code length).

In one embodiment, in an embodiment of the present invention, the first mother code length may be determined according to the following formula:

$$N=2^{floor[log2(L-1)]+1}, \text{ where}$$

N is the first mother code length, L is the target code length, and floor[ ] indicates rounding down.

For example, if a target code length is 250, a mother code length obtained according to the foregoing formula may be 256.

It should be understood that the foregoing formula is merely an example. In actual application, the first mother code length may be determined based on a relationship between the mother code length and the target code length. This is not limited in this embodiment of the present invention.

In one embodiment, the target code length may be determined based on a value of a resource quantity corresponding to the information bit sequence, or may be obtained in another manner. This is not limited in this embodiment of the present invention.

Operation S120. Perform polar code coding on the information bit sequence based on the first mother code length and mapping relationship information, where the mapping relationship information includes a correspondence between a mother code length and at least one of the following: a transport block size, a construction work point, or a construction sequence.

In this embodiment of the present invention, the mapping relationship information is set based on the mother code length. In this way, during coding, a first transport block size, a construction work point, or a construction sequence corresponding to the information bit sequence may be directly determined based on the first mother code length and the mapping relationship information.

In one embodiment, in an embodiment of the present invention, the mapping relationship information may include a correspondence between the mother code length and the transport block size. In this case, the communications device may determine, based on the first mother code length and the mapping relationship information, the first transport block size corresponding to the information bit sequence, and perform polar code coding on the information bit sequence based on the first transport block size. In one embodiment, the communications device may determine, or may be in a form of a table, and a specific representation form of the mapping relationship information is not limited in this embodiment of the present invention.

The following uses an example in which the mapping relationship information includes the correspondence among the transport block size index, the mother code length, and the transport block size for detailed description. In one embodiment, the correspondence among the transport block size index, the mother code length, and the transport block size may be shown in Table 1. It should be understood that the correspondence may include some or all information in the following table, in other words, the correspondence may be a correspondence constituted of some rows and/or some columns.

TABLE 1

TBS table provided in this embodiment

| $I_{TBs}$ | N |  |  |  |  |  |  |  |  |  |  |
|---|---|---|---|---|---|---|---|---|---|---|---|
|  | 64 | 128 | 256 | 512 | 1024 | 2048 | 4096 | 8192 | 16384 | 32768 | 65536 |
| 0 | 16 | 20 | 20 | 42 | 82 | 170 | 340 | 600 | 1300 | 4000 | 5500 |
| 1 | 18 | 24 | 26 | 66 | 136 | 200 | 528 | 902 | 2000 | 5000 | 8000 |
| 2 | 19 | 28 | 34 | 84 | 192 | 294 | 715 | 1000 | 2750 | 6000 | 11000 |
| 3 | 20 | 32 | 40 | 100 | 200 | 400 | 900 | 1338 | 3500 | 8000 | 14000 |
| 4 | 22 | 36 | 48 | 130 | 246 | 512 | 1000 | 1774 | 4250 | 9000 | 17000 |
| 5 | 23 | 40 | 56 | 158 | 300 | 600 | 1284 | 2000 | 5000 | 10500 | 20000 |
| 6 | 24 | 46 | 70 | 182 | 354 | 650 | 1460 | 2212 | 5750 | 12000 | 23000 |
| 7 | 26 | 52 | 80 | 206 | 400 | 730 | 1650 | 2648 | 6500 | 13500 | 26000 |
| 8 | 27 | 56 | 90 | 228 | 458 | 840 | 1830 | 3086 | 7250 | 15000 | 29000 |
| 9 | 28 | 60 | 100 | 252 | 504 | 948 | 2000 | 3522 | 8000 | 16500 | 32000 |
| 10 | 30 | 64 | 112 | 276 | 552 | 1000 | 2200 | 3960 | 8750 | 18000 | 35000 |
| 11 | 31 | 70 | 124 | 298 | 598 | 1058 | 2376 | 4000 | 9500 | 19500 | 38000 |
| 12 | 32 | 76 | 138 | 322 | 644 | 1168 | 2594 | 4396 | 10250 | 21000 | 41000 |
| 13 | 34 | 84 | 150 | 346 | 692 | 1276 | 2770 | 4834 | 11000 | 22500 | 44000 |
| 14 | 36 | 92 | 160 | 368 | 738 | 1386 | 2950 | 5270 | 11750 | 24000 | 47000 |
| 15 | 38 | 100 | 172 | 392 | 786 | 1495 | 3140 | 5708 | 12500 | 25500 | 50000 |
| 16 |  |  | 180 | 416 | 832 | 1604 | 3330 | 6000 | 13250 | 27000 | 53000 |
| 17 |  |  | 192 | 438 | 880 | 1714 | 3500 | 6550 | 14000 | 28500 | 56000 |
| 18 |  |  | 206 | 460 | 928 | 1822 | 3686 | 7100 | 14750 | 30000 | 59000 |
| 19 |  |  | 220 | 480 | 972 | 1940 | 3890 | 7650 | 15500 | 31000 | 62000 | based on the first transport block size, the construction work point or the construction sequence corresponding to the information bit sequence, and perform polar code coding on the information bit sequence based on the construction work point or the construction sequence corresponding to the information bit sequence.

It should be understood that a function of the mapping relationship information in this embodiment of the present invention is to determine, based on the mother code length, the transport block size corresponding to the mother code length. For example, the mapping relationship information may include a correspondence among a transport block size index, the mother code length, and the transport block size. For another example, the mapping relationship information may include a correspondence among a code rate, the mother code length, and the transport block size. Alternatively, the mapping relationship information may include a correspondence between a code rate and the transport block size index. This is not limited in this embodiment of the present invention.

It should be further understood that the mapping relationship information in this embodiment of the present invention may be information that is pre-stored by an encoding/decoding end, and the mapping relationship information may be represented in a plurality of forms. For example, the mapping relationship information may be a string of values, $I_{TBS}$ in Table 1 indicates the transport block size index, and a value is 0 to 19. N indicates the mother code length, and a value is 2 raised to the power of a positive integer, for example, a specific value is 64, 128, or 256. Another value in the table indicates a corresponding transport block size. For example, when $I_{TBS}$ is 0 and N is 64, a corresponding transport block size is 16 bits. When $I_{TBS}$ is 1 and N is 128, a corresponding transport block size is 24 bits, and the like. It should be understood that Table 1 is merely an example, and a specific value in the table is not specifically limited in this embodiment of the present invention. For example, a value of the transport block size in Table 1 may be determined according to an actual situation. For another example, N in Table 1 may also be another value, for example, may also be 32, or 131072. For N in Table 1, a quantity of levels of the mother code length in the table may also be appropriately increased or decreased based on an actual code length range. For example, the last three columns in Table 1 are deleted, and a maximum length of supported by N is 8192. For another example, a sequence number of $I_{TBS}$ in Table 1 is merely an example. Different transport block sizes corresponding to each mother code length are not necessarily arranged in ascending order, or may be arranged in descending order, or even may not be arranged in an order. An index value order of different mother code lengths may be consistent with or entirely independent of a transport block size order. For another example, a range of the transport block size in Table 1 may also be extended or reduced based on a code rate and a code length that are used in an actual application scenario.

Therefore, according to the polar code coding method provided in this embodiment of the present invention, the mapping relationship information is graded based on a mother code length of a polar code, so as to effectively reduce grading density of the transport block size in a polar code coding process, and reduce coding overheads.

In one embodiment, in another embodiment of the present invention, the mapping relationship information may include a correspondence between the mother code length and the construction work point. In this case, the communications device may determine, based on the first mother code length and the mapping relationship information, a first construction work point corresponding to the information bit sequence, and perform polar code coding on the information bit sequence based on the first construction work point.

In one embodiment, the communications device may online calculate a construction sequence based on a construction work point. The construction sequence is used to indicate a location of an information bit and/or a location of a fixed bit during coding. For example, a receive end and a transmit end may generate a same construction sequence based on an agreed construction algorithm and the construction work point, to ensure correct decoding. The communications device may also perform offline storage based on the calculated construction sequence, and the construction sequence may be generated based on the construction work point.

In one embodiment, the construction work point may select a signal-to-noise ratio near a frame error rate of 10 raised to the power of −1 or −2. A sequence constructed in a case of a construction work point of the signal-to-noise ratio can ensure relatively good performance of the polar code in a work interval of the polar code.

It should be understood that in this embodiment of the present invention, a function of the mapping relationship information is to determine the construction work point of the information bit sequence based on the mother code length. For example, the mapping relationship information may include a correspondence among a transport block size index, the mother code length, and the construction work point, to be specific, the construction work point of the information bit sequence is determined based on the transport block size index of the information bit sequence and the first mother code length of the information bit sequence. For another example, the mapping relationship information may include a correspondence among a code rate, the mother code length, and the construction work point. For another example, the mapping relationship information may further include a correspondence between a code rate and the transport block size index. In addition, the mapping relationship information in various embodiments of the present invention may be combined, or may be separated. This is not limited in this embodiment of the present invention.

It should be further understood that the mapping relationship information in this embodiment of the present invention may be information that is pre-stored by the encoding/decoding end, and the mapping relationship information may be represented in the plurality of forms. For example, the mapping relationship information may be a string of values, or may be in a form of a table, and a specific representation form of the mapping relationship information is not limited in this embodiment of the present invention.

For example, when the mapping relationship information is in the form of the table, the correspondence among the transport block size index, the mother code length, and the construction work point may be specifically shown in the following Table 2. It should be understood that the correspondence may include some or all information in the following table, in other words, the correspondence may be a correspondence constituted of some rows and/or some columns. For example, only the mother code length is included in a horizontal dimension of Table 2, and a combination of the mother code length and the transport block size index directly corresponds to the construction work point.

TABLE 2

TBS table and corresponding construction work points provided in this embodiment

| | | | | N | | | | | |
|---|---|---|---|---|---|---|---|---|---|
| $I_{TBs}$ | 64 | CSNR | 128 | CSNR | 256 | CSNR | 512 | CSNR | 1024 | CSNR |
| 0 | 16 | 5.377 | 20 | 4.1389 | 20 | 3.6549 | 42 | 2.1699 | 82 | 1.3 |
| 1 | 18 | 5.2084 | 24 | 3.7259 | 26 | 3.2263 | 66 | 1.655 | 136 | 0.9863 |
| 2 | 19 | 5.1599 | 28 | 3.5123 | 34 | 2.7537 | 84 | 1.4834 | 192 | 0.8907 |
| 3 | 20 | 5.0827 | 32 | 3.3621 | 40 | 2.5648 | 100 | 1.4187 | 200 | 0.8897 |
| 4 | 22 | 5.044 | 36 | 3.3061 | 48 | 2.3311 | 130 | 1.3581 | 246 | 0.9346 |
| 5 | 23 | 5.0141 | 40 | 3.2353 | 56 | 2.2119 | 158 | 1.4122 | 300 | 1.001 |
| 6 | 24 | 5.0105 | 46 | 3.1878 | 70 | 2.0803 | 182 | 1.4798 | 354 | 1.078 |
| 7 | 26 | 5.0403 | 52 | 3.1738 | 80 | 2.1721 | 206 | 1.5917 | 400 | 1.1982 |
| 8 | 27 | 5.0689 | 56 | 3.2737 | 90 | 2.1345 | 228 | 1.6957 | 458 | 1.3188 |
| 9 | 28 | 5.086 | 60 | 3.2907 | 100 | 2.1734 | 252 | 1.8289 | 504 | 1.4884 |
| 10 | 30 | 5.1849 | 64 | 3.3993 | 112 | 2.2503 | 276 | 1.971 | 552 | 1.6786 |
| 11 | 31 | 5.2379 | 70 | 3.507 | 124 | 2.3663 | 298 | 2.1607 | 598 | 1.8632 |
| 12 | 32 | 5.2484 | 76 | 3.7313 | 138 | 2.4826 | 322 | 2.3611 | 644 | 2.0591 |
| 13 | 34 | 5.4304 | 84 | 4.079 | 150 | 2.7023 | 346 | 2.6133 | 692 | 2.2783 |
| 14 | 36 | 5.6668 | 92 | 4.609 | 160 | 2.8891 | 368 | 2.8582 | 738 | 2.5767 |
| 15 | 38 | 5.9165 | 100 | 5.4303 | 172 | 3.1032 | 392 | 3.2032 | 786 | 2.8966 |
| 16 | | | | | 180 | 3.2855 | 416 | 3.5998 | 832 | 3.2643 |
| 17 | | | | | 192 | 3.6439 | 438 | 4.0839 | 880 | 3.7595 |
| 18 | | | | | 206 | 4.1581 | 460 | 4.7734 | 928 | 4.4459 |
| 19 | | | | | 220 | 5.0084 | 480 | 5.8749 | 972 | 5.4819 |

$I_{TBS}$ in Table 2 indicates the transport block size index, and a value is 0 to 19. N indicates the mother code length, and a value is 2 raised to the power of a positive integer, for example, a specific value is 64, 128, or 256. A value under the mother code length in the table indicates a corresponding transport block size. A value under the CSNR in the table indicates a corresponding construction work point. For example, when $I_{TBs}$ is 0 and N is 64, a corresponding transport block size is 16 bits, and a corresponding construction work point is 5.377 dB. When $I_{TBs}$ is 1 and N is 128, a corresponding transport block size is 20 bits, and a corresponding construction work point is 4.1389 dB, and the like. It should be understood that Table 2 is merely an example, and a value in the table is not specifically limited in this embodiment of the present invention. For example, a value of the transport block size in Table 2 may be determined according to an actual situation. For another example, N in Table 2 may also be another value, for example, may also be 32, or 131072. For another example, for N, a quantity of levels of the mother code length in Table 2 may also be appropriately increased or decreased based on an actual code length range. For another example, a range of the transport block size in Table 2 may also be extended or reduced based on a code rate and a code length that are used in an actual application scenario. For another example, a sequence number of $I_{TBS}$ in Table 2 is merely an example. Different transport block sizes and CSNRs corresponding to each mother code length are not necessarily arranged in ascending order, or may be arranged in descending order, or even may not be arranged in an order. An index value order of different mother code lengths may be consistent with or entirely independent of a transport block size order and CSNRs.

It should be understood that using a fixed construction work point is to ensure that construction sequences of the receive end and the transmit end are consistent. Because the performance of the polar code is insensitive to the construction work point within a specific range, a specific value of the construction work point CSNR is not limited to that shown in the table, or may be obtained by adjusting a CSNR value corresponding to each transport block size in Table 2.

Therefore, according to the polar code coding method provided in this embodiment of the present invention, based on the first mother code length that is corresponding to the to-be-transmitted information bit sequence and that is determined based on the target code length, polar code coding is performed on the information bit sequence by directly using the first construction work point that is corresponding to the information bit sequence and that is determined based on a mother code length of a polar code, so as to effectively reduce grading density of the construction work point in a polar code coding process, and reduce coding overheads.

In one embodiment, in another embodiment of the present invention, the mapping relationship information may include a correspondence between the mother code length and the construction sequence. In this case, the communications device may determine, based on the first mother code length and the mapping relationship information, a first construction sequence corresponding to the information bit sequence, where the first construction sequence is used to indicate the location of the information bit and/or the location of the fixed bit during coding of the information bit sequence; and perform polar code coding on the information bit sequence based on the first construction sequence.

In this embodiment of the present invention, a function of the mapping relationship information is to determine the first construction sequence of the information bit sequence based on the first mother code length of the information bit sequence. For example, the mapping relationship information may include a correspondence among a code rate, the mother code length, and the construction sequence, or the mapping relationship information may include a correspondence between a code rate and a transport block size index. The mapping relationship information in various embodiments of the present invention may be combined, or may be separated. This is not limited in this embodiment of the present invention.

In one embodiment, the mapping relationship information may include a correspondence among the transport block size index, the mother code length, and the construction sequence. In one embodiment, the communications device may determine the first construction sequence of the information bit sequence based on a transport block size index of the information bit sequence and the first mother code length of the information bit sequence.

In this embodiment of the present invention, as shown in FIG. 3, a corresponding polar code construction sequence may also be designed based on the mother code length, to be specific, each pair of parameters ($I_{TBS}$, N) in a TBS table correspond to one construction sequence. In one embodiment, the construction sequence in the mapping relationship information includes a first value and a second value, the first value is used to indicate the location of the information bit, and the second value is used to indicate the location of the fixed bit. For example, as shown in FIG. 3, the first value is "1", and the second value is "0".

In one embodiment, the construction sequence in the mapping relationship information may also include a location sequence number arranged based on a priority. For example, FIG. 4 is a location sequence number arranged based on a priority of a polar channel in a case of a code length of 256. A location of a corresponding information bit may be selected from front to back based on the TBS, or a location of a fixed bit is selected from back to front. For example, if the mother code length is 256, and a quantity of information bits is 3, channel sequence numbers of the information bits are 256, 255, and 254, and fixed bits are placed at remaining locations. Alternatively, the location of the fixed bit may be selected from back to front. For example, if a quantity of fixed bits is 3, channel sequence numbers of the fixed bits are 1, 2, and 3, and information bits are placed at remaining locations.

It should be understood that different transport block sizes in the mapping relationship information may respectively correspond to a construction sequence, and a plurality of transport block sizes may also correspond to a same construction sequence. For example, if in a case of a same mother code length, there is an inclusion relationship between locations that are of transmission information bits and that are corresponding to a plurality of transport block size indexes, the plurality of transport block size indexes may correspond to a same construction sequence. For example, as shown in FIG. 4, in a case of a same mother code length of 256, channel sequence numbers that are of a transmission information bit and that are corresponding to a first transport block are 256, 255, and 254, and channel sequence numbers that are of a transmission information bit and that are corresponding to a second transport block are 256, 255, 254, 252, and 248. To be specific, the channel sequence numbers that are of the transmission information bit and that are corresponding to the second transport block include the channel sequence numbers that are of the transmission information bit and that are corresponding to the first transport block. Further, a construction sequence corresponding to the first transport block and a construction sequence corresponding to the second transport block may be set to a same construction sequence, to be specific, the location sequence number arranged based on the priority of the polar channel.

It should be understood that a representation form of the construction sequence is not limited to the example. For example, the construction sequence may also be in a compression form, relative magnitude of reliability, in a compression form of relative magnitude of reliability, or relative magnitude of polar weight. This is not limited in this embodiment of the present invention.

It should be further understood that, in a process in which the communications device performs polar code coding based on the construction work point, the mapping relationship information may also include a correspondence among the construction work point, the construction sequence, and the transport block size.

Therefore, according to the polar code coding method provided in this embodiment of the present invention, based on the first mother code length that is corresponding to the to-be-transmitted information bit sequence and that is determined based on the target code length, polar code coding is performed on the information bit sequence by directly using the construction sequence that is corresponding to the information bit sequence and that is determined based on the first mother code length, so as to effectively reduce grading density of the construction sequence in a polar code coding process, and reduce coding overheads.

In the polar code coding process, the mother code is first obtained, and then rate matching may be further performed, to obtain target code. Therefore, in an embodiment of the present invention, the method 100 may further include:

performing rate matching on a coded sequence based on the target code length, to obtain a target code sequence.

The target code that is finally required may be obtained through the rate matching. The rate matching may be performed in an existing manner. This is not limited in this embodiment of the present invention.

Figure 5:
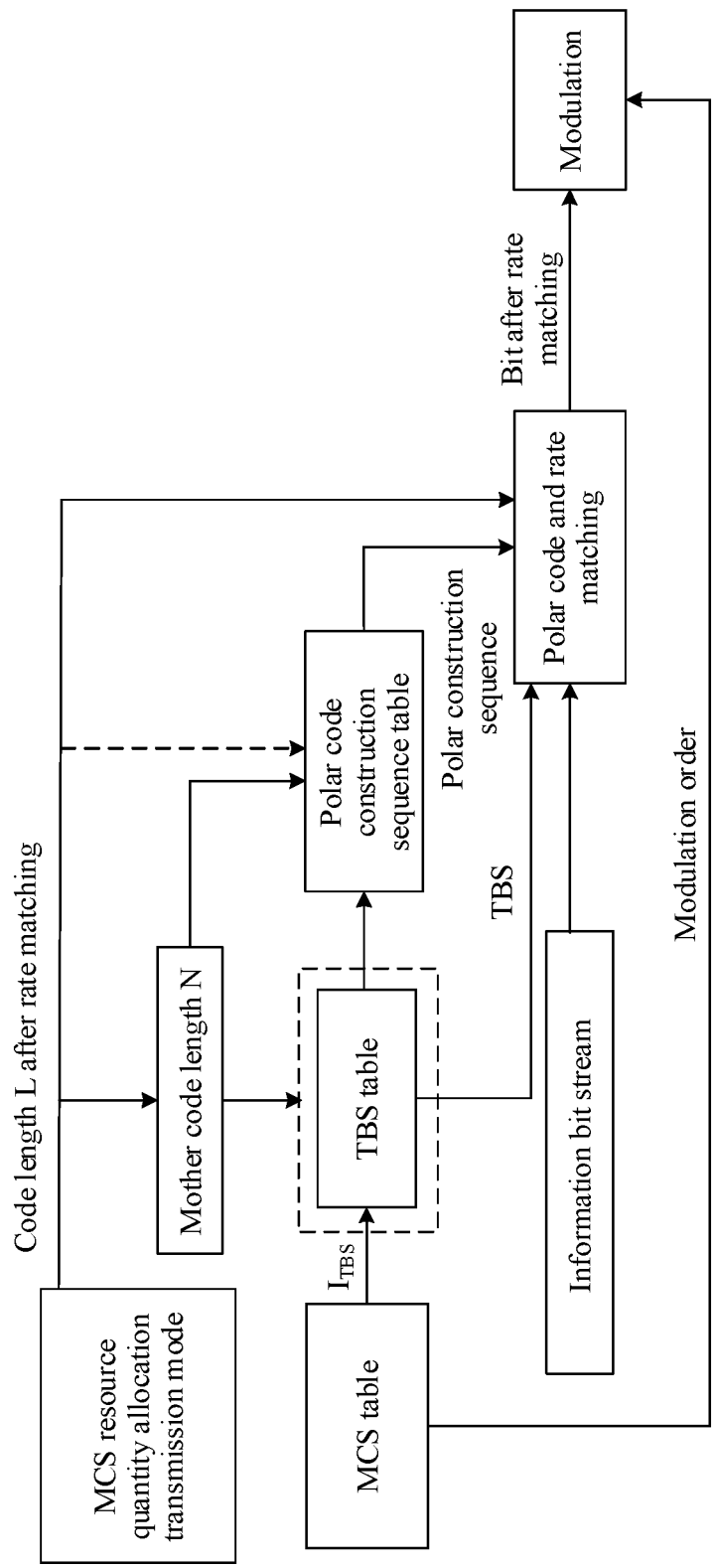
FIG. 5 is a schematic flowchart of polar code coding according to an embodiment of the present invention.
Figure 6:
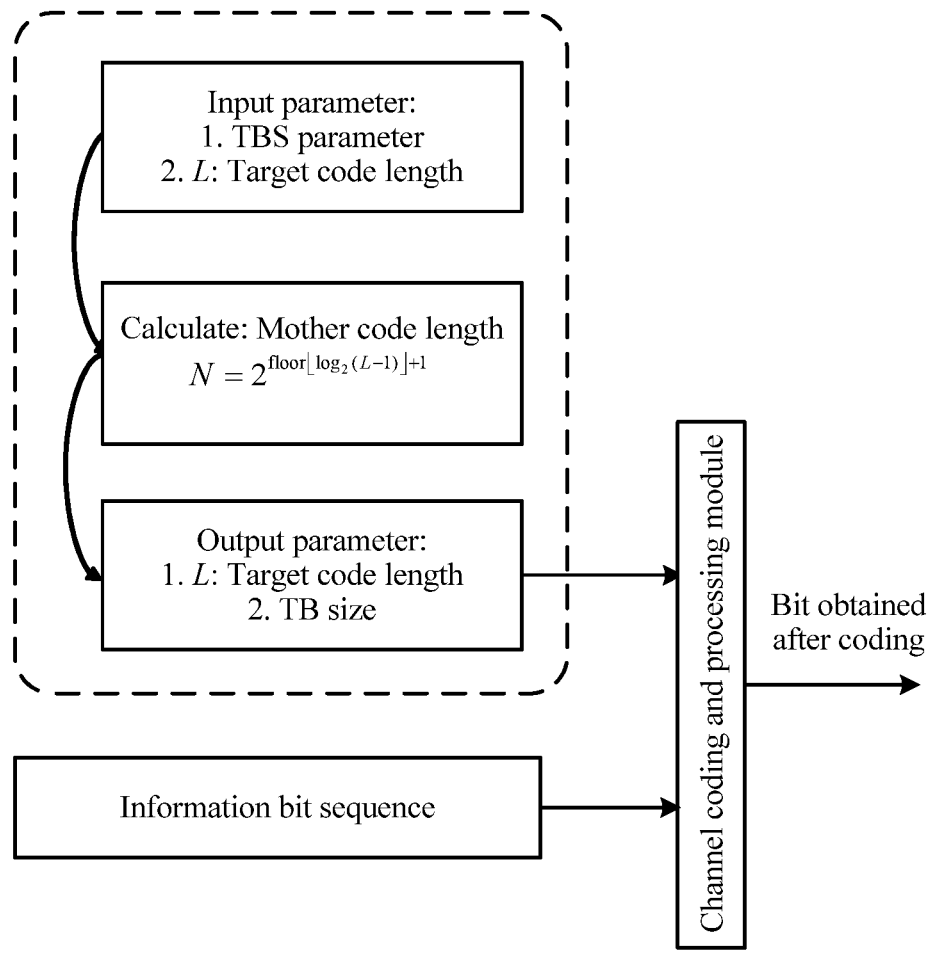
FIG. 6 is a schematic flowchart of polar code coding according to another embodiment of the present invention.

The following uses FIG. 5 and FIG. 6 as an example to describe a polar code coding procedure in an embodiment of the present invention. It should be understood that FIG. 5 and FIG. 6 are merely intended to help a person skilled in the art better understand the embodiments of the present invention rather than limiting the scope of the embodiments of the present invention.

As shown in FIG. 5, before coding, a transport block size index $I_{TBS}$ is first determined based on a modulation and coding scheme (MCS). A target code length L (namely, a code length obtained after rate matching) corresponding to an information bit sequence is determined based on a value of a resource quantity required for the information bit sequence that needs to be sent. Then, a mother code length N corresponding to the information bit sequence is determined based on the target code length L corresponding to the information bit sequence. A transport block size TBS corresponding to the information bit sequence may be obtained based on the mother code length N and $I_{TBS}$ by querying a TBS table, and further, polar code coding may be performed on the information bit sequence based on the TBS. If there has been a construction sequence list, a construction sequence may also be obtained by directly querying the construction sequence list, and further polar code coding is directly performed on the information bit sequence based on the construction sequence. If there has been a construction work point table (which may be combined into the TBS table), a construction work point may be obtained by querying the construction work point table, a construction sequence is determined based on the construction work point, and further polar code coding is performed on the information bit sequence based on the construction sequence. Then, rate matching is performed on mother code obtained through coding, to obtain target code (namely, a bit obtained after the rate matching).

FIG. 6 shows a polar code coding procedure by using an example of querying a TBS table. In FIG. 6, a TBS parameter may be a transport block size index $I_{TBS}$. After $I_{TBS}$ and a target code length L are obtained, a mother code length N is first determined based on the target code length L, and then a TBS table in an embodiment of the present invention is queried, to obtain a TBS. A channel coding and processing module further performs coding and rate matching on an information bit sequence based on the TBS and the target code length L, to obtain target code (namely, a bit obtained after coding).

Therefore, the polar code coding method provided in this embodiment of the present invention may directly perform polar code coding on the information bit sequence based on at least one of a first transport block size corresponding to the information bit sequence, a first construction work point corresponding to the information bit sequence, or a first construction sequence corresponding to the information bit sequence that are determined based on a mother code length of a polar code, so as to effectively reduce coding overheads in the polar code coding process.

The foregoing describes in detail a polar code coding method according to an embodiment of the present invention with reference to FIG. 1 to FIG. 6. The following describes an apparatus according to an embodiment of the present invention with reference to FIG. 7 and FIG. 8.

Figure 7:
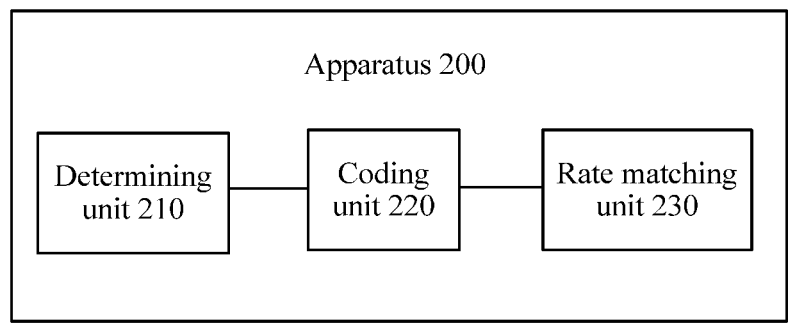
FIG. 7 is a schematic block diagram of a polar code coding apparatus according to an embodiment of the present invention.

FIG. 7 is a schematic block diagram of a polar code coding apparatus 200 according to an embodiment of the present invention. The apparatus 200 is configured in a communications device, for example, a network device or a terminal device. The apparatus 200 is configured to perform polar code coding on a to-be-transmitted information bit sequence. As shown in FIG. 7, the apparatus 200 includes a determining unit 210 and a coding unit 220.

The determining unit 210 is configured to determine, based on a target code length corresponding to an information bit sequence, a first mother code length corresponding to the information bit sequence.

In one embodiment, the first mother code length may be determined according to the following formula:

$$N=2^{floor[log2(L-1)]+1}, \text{ where}$$

N is the first mother code length, L is the target code length, and floor[ ] indicates rounding down.

It should be understood that the foregoing formula is merely an example. In actual application, the first mother code length may be determined based on a relationship between a mother code length and a target code length. This is not limited in this embodiment of the present invention.

In one embodiment, the target code length may be determined based on a value of a resource quantity corresponding to the information bit sequence, or may be obtained in another manner. This is not limited in this embodiment of the present invention.

The coding unit 220 is configured to perform polar code coding on the information bit sequence based on the first mother code length and mapping relationship information, where the mapping relationship information includes a correspondence between a mother code length and at least one of the following: a transport block size, a construction work point, or a construction sequence.

It should be understood that the mapping relationship information in this embodiment of the present invention may be information that is pre-stored by a transmit end or a receive end, and the mapping relationship information may be represented in a plurality of forms. For example, the mapping relationship information may be a string of values, or may be in a form of a table, and a specific representation form of the mapping relationship information is not limited in this embodiment of the present invention.

In one embodiment, in an embodiment of the present invention, the mapping relationship information may include a correspondence between the mother code length and the transport block size. The coding unit 220 is further configured to: determine, based on the first mother code length and the mapping relationship information, a first transport block size corresponding to the information bit sequence; and perform polar code coding on the information bit sequence based on the first transport block size.

It should be understood that in this embodiment of the present invention, a function of the mapping relationship information is to determine, based on the mother code length, the transport block size corresponding to the mother code length. For example, the mapping relationship information may include a correspondence among a code rate, the mother code length, and the transport block size. Alternatively, the mapping relationship information may include a correspondence between a code rate and a transport block size index. This is not limited in this embodiment of the present invention.

In one embodiment, the mapping relationship information may be a correspondence among the transport block size index, the mother code length, and the transport block size.

In one embodiment, as shown in Table 1, in a correspondence table in which the transport block size index is a vertical dimension and the mother code length is a horizontal dimension, and values corresponding to different combinations of the mother code length and the transport block size index are the transport block size. It should be understood that the correspondence may include some or all information in the table, in other words, the correspondence may be a correspondence constituted of some rows and/or some columns.

Therefore, according to the polar code coding apparatus provided in this embodiment of the present invention, the mapping relationship information is graded based on a mother code length of a polar code, so as to effectively reduce grading density of the transport block size in a polar code coding process, and reduce coding overheads.

In one embodiment, in another embodiment of the present invention, the mapping relationship information may include a correspondence between the mother code length and the construction work point. The coding unit 220 is further configured to: determine, based on the first mother code length and the mapping relationship information, a first construction work point corresponding to the information bit sequence; and perform polar code coding on the information bit sequence based on the first construction work point.

It should be understood that in this embodiment of the present invention, a function of the mapping relationship information is to determine the construction work point of the information bit sequence based on the mother code length. For example, the mapping relationship information may include a correspondence among a code rate, the mother code length, and the construction work point. For another example, the mapping relationship information may further include a correspondence between a code rate and a transport block size index. This is not limited in this embodiment of the present invention.

In one embodiment, the mapping relationship information may include a correspondence among the transport block size index, the mother code length, and the construction work point.

In one embodiment, as shown in Table 2, in a correspondence table in which the transport block size index is a vertical dimension, the mother code length and the construction work point are a horizontal dimension, values corresponding to different combinations of the mother code length and the transport block size index are construction work points, and values corresponding to different combinations of the mother code length and the transport block size are construction work points. It should be understood that the correspondence may include some or all information in the table, in other words, the correspondence may be a correspondence constituted of some rows and/or some columns. For example, only the mother code length is included in the horizontal dimension of Table 2, and a combination of the mother code length and the transport block size index directly corresponds to the construction work point.

Therefore, according to the polar code coding apparatus provided in this embodiment of the present invention, based on the first mother code length that is corresponding to the to-be-transmitted information bit sequence and that is determined based on the target code length, polar code coding is performed on the information bit sequence by directly using the first construction work point that is corresponding to the information bit sequence and that is determined based on a mother code length of a polar code, so as to effectively reduce grading density of the construction work point in a polar code coding process, and reduce coding overheads.

In one embodiment, in another embodiment of the present invention, the mapping relationship information may include a correspondence between the mother code length and the construction sequence. The coding unit 220 is further configured to: determine, based on the first mother code length and the mapping relationship information, a first construction sequence corresponding to the information bit sequence, where the first construction sequence is used to indicate a location of an information bit and/or a location of a fixed bit during coding of the information bit sequence; and perform polar code coding on the information bit sequence based on the first construction sequence.

It should be understood that in this embodiment of the present invention, a function of the mapping relationship information is to determine the construction sequence of the information bit sequence based on the mother code length. For example, the mapping relationship information may include a correspondence among a code rate, the mother code length, and the construction sequence. For another example, the mapping relationship information may further include a correspondence between a code rate and a transport block size index. This is not limited in this embodiment of the present invention.

In one embodiment, the mapping relationship information may include a correspondence among the transport block size index, the mother code length, and the construction sequence.

In one embodiment, the construction sequence in the mapping relationship information includes a first value and a second value, the first value is used to indicate the location of the information bit, and the second value is used to indicate the location of the fixed bit. For example, as shown in FIG. 3, the first value is "1", and the second value is "0".

In one embodiment, as shown in FIG. 4, the construction sequence in the mapping relationship information may also include a location sequence number arranged based on a priority.

It should be understood that different transport block sizes in the mapping relationship information may respectively correspond to a construction sequence, and a plurality of transport block sizes may also correspond to a same construction sequence. For example, if in a case of a same mother code length, there is an inclusion relationship between locations that are of transmission information bits and that are corresponding to a plurality of transport block size indexes, the plurality of transport block size indexes may correspond to a same construction sequence.

Therefore, according to the polar code coding apparatus provided in this embodiment of the present invention, based on the first mother code length that is corresponding to the to-be-transmitted information bit sequence and that is determined based on the target code length, polar code coding is performed on the information bit sequence by directly using the construction sequence that is corresponding to the information bit sequence and that is determined based on the first mother code length, so as to effectively reduce grading density of the construction sequence in a polar code coding process, and reduce coding overheads.

It should be understood that a representation form of the construction sequence is not limited to the example. For example, the construction sequence may also be in a compression form, relative magnitude of reliability, or in a compression form of relative magnitude of reliability. This is not limited in this embodiment of the present invention.

It should be further understood that, in a process in which the communications device performs polar code coding based on the construction work point, the mapping relationship information may also include a correspondence among the construction work point, the construction sequence, and the transport block size. The mapping relationship information in various embodiments of the present invention may be combined, or may be separated. This is not limited in this embodiment of the present invention.

In one embodiment, the apparatus 200 further includes:

a rate matching unit 230, configured to perform rate matching on a coded sequence based on the target code length, to obtain a target code sequence.

It should be understood that the rate matching may be performed in an existing manner. This is not limited in this embodiment of the present invention.

Therefore, the polar code coding apparatus provided in this embodiment of the present invention may directly perform polar code coding on the information bit sequence based on at least one of the first transport block size corresponding to the information bit sequence, the first construction work point corresponding to the information bit sequence, or the first construction sequence corresponding to the information bit sequence that are determined based on a mother code length of a polar code, so as to effectively reduce the coding overheads in the polar code coding process.

Figure 8:
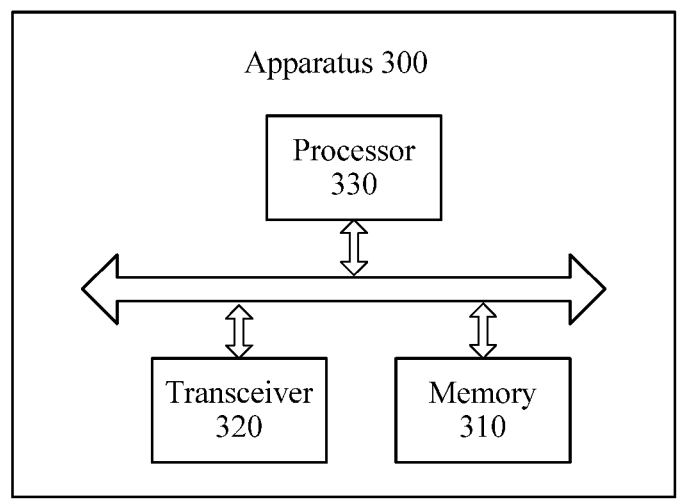
FIG. 8 is a schematic block diagram of a polar code coding apparatus according to another embodiment of the present invention.

FIG. 8 is a schematic block diagram of a polar code coding apparatus 300 according to another embodiment of the present invention. It should be understood that, the apparatus 300 in FIG. 8 can implement each operation of the polar code coding method in FIG. 2 and a function of each module in FIG. 7. For brevity, repeated description is appropriately omitted, and the apparatus 300 includes:

a memory 310, configured to store a program and mapping relationship information;

a transceiver 320, configured to communicate with another device, and further configured to: receive an information bit sequence and send a target sequence; and a processor 330, configured to execute the program in the memory 310. When the program is executed, the processor 330 is configured to: determine, based on a target code length corresponding to the information bit sequence, a first mother code length corresponding to the information bit sequence; and perform polar code coding on the information bit sequence based on the first mother code length and the mapping relationship information, where the mapping relationship information includes a correspondence between a mother code length and at least one of the following: a transport block size, a construction work point, or a construction sequence.

In one embodiment, the first mother code length may be determined according to the following formula:

$$N=2^{floor\lfloor log2(L-1)\rfloor+1}, \text{ where}$$

N is the first mother code length, L is the target code length, and floor[ ] indicates rounding down.

It should be understood that the foregoing formula is merely an example. In actual application, the first mother code length may be determined based on a relationship between the mother code length and a target code length. This is not limited in this embodiment of the present invention.

In one embodiment, the target code length may be determined based on a value of a resource quantity corresponding to the information bit sequence, or may be obtained in another manner. This is not limited in this embodiment of the present invention.

It should be understood that the mapping relationship information in this embodiment of the present invention may be information that is pre-stored by an encoding/decoding end, and the mapping relationship information may be represented in a plurality of forms. For example, the mapping relationship information may be a string of values, or may be in a form of a table, and a specific representation form of the mapping relationship information is not limited in this embodiment of the present invention.

In one embodiment, in an embodiment of the present invention, the mapping relationship information may include a correspondence between the mother code length and the transport block size. The processor 330 is further configured to: determine, based on the first mother code length and the mapping relationship information, a first transport block size corresponding to the information bit sequence; and perform polar code coding on the information bit sequence based on the first transport block size.

It should be understood that in this embodiment of the present invention, a function of the mapping relationship information is to determine, based on the mother code length, the transport block size corresponding to the mother code length. For example, the mapping relationship information may include a correspondence among a code rate, the mother code length, and the transport block size. Alternatively, the mapping relationship information may include a correspondence between a code rate and a transport block size index. This is not limited in this embodiment of the present invention.

In one embodiment, the mapping relationship information may be a correspondence among the transport block size index, the mother code length, and the transport block size.

In one embodiment, as shown in Table 1, in a correspondence table in which the transport block size index is a vertical dimension and the mother code length is a horizontal dimension, and values corresponding to different combinations of the mother code length and the transport block size index are the transport block size. It should be understood that the correspondence may include some or all information in the table, in other words, the correspondence may be a correspondence constituted of some rows and/or some columns.

Therefore, according to the polar code coding apparatus provided in this embodiment of the present invention, the mapping relationship information is graded based on a mother code length of a polar code, so as to effectively reduce grading density of the transport block size in a polar code coding process, and reduce coding overheads.

In one embodiment, in another embodiment of the present invention, the mapping relationship information may include a correspondence between the mother code length and the construction work point. The processor 330 is further configured to: determine, based on the first mother code length and the mapping relationship information, a first construction work point corresponding to the information bit sequence; and perform polar code coding on the information bit sequence based on the first construction work point.

It should be understood that in this embodiment of the present invention, a function of the mapping relationship information is to determine the construction work point of the information bit sequence based on the mother code length. For example, the mapping relationship information may include a correspondence among a code rate, the mother code length, and the construction work point. For another example, the mapping relationship information may further include the correspondence between a code rate and a transport block size index. This is not limited in this embodiment of the present invention.

In one embodiment, the mapping relationship information may include a correspondence among the transport block size index, the mother code length, and the construction work point.

In one embodiment, as shown in Table 2, in a correspondence table in which the transport block size index is a vertical dimension, the mother code length and the construction work point are a horizontal dimension, values corresponding to different combinations of the mother code length and the transport block size index are construction work points, and values corresponding to different combinations of the mother code length and the transport block size are construction work points. It should be understood that the correspondence may include some or all information in the table, in other words, the correspondence may be a correspondence constituted of some rows and/or some columns. For example, only the mother code length is included in the horizontal dimension of Table 2, and a combination of the mother code length and the transport block size index directly corresponds to the construction work point.

Therefore, according to the polar code coding apparatus provided in this embodiment of the present invention, based on the first mother code length that is corresponding to the to-be-transmitted information bit sequence and that is determined based on the target code length, polar code coding is performed on the information bit sequence by directly using the first construction work point that is corresponding to the information bit sequence and that is determined based on a mother code length of a polar code, so as to effectively reduce grading density of the construction work point in a polar code coding process, and reduce coding overheads.

In one embodiment, in another embodiment of the present invention, the mapping relationship information may include a correspondence between the mother code length and the construction sequence. The processor 330 is further configured to: determine, based on the first mother code length and the mapping relationship information, a first construction sequence corresponding to the information bit sequence, where the first construction sequence is used to indicate a location of an information bit and/or a location of a fixed bit during coding of the information bit sequence; and perform polar code coding on the information bit sequence based on the first construction sequence.

It should be understood that in this embodiment of the present invention, a function of the mapping relationship information is to determine the construction sequence of the information bit sequence based on the mother code length.

In one embodiment, the mapping relationship information may include a correspondence among a transport block size index, the mother code length, and the construction sequence.

In one embodiment, the construction sequence in the mapping relationship information includes a first value and a second value, the first value is used to indicate the location of the information bit, and the second value is used to indicate the location of the fixed bit. For example, as shown in FIG. 3, the first value is "1", and the second value is "0".

In one embodiment, as shown in FIG. 4, the construction sequence in the mapping relationship information may also include a location sequence number arranged based on a priority.

It should be understood that different transport block sizes in the mapping relationship information may respectively correspond to a construction sequence, and a plurality of transport block sizes may also correspond to a same construction sequence. For example, if in a case of a same mother code length, there is an inclusion relationship between locations that are of transmission information bits and that are corresponding to a plurality of transport block size indexes, the plurality of transport block size indexes may correspond to a same construction sequence.

In one embodiment, the processor 330 is further configured to perform rate matching on a coded sequence based on the target code length, to obtain a target code sequence.

It should be understood that the rate matching may be performed in an existing manner. This is not limited in this embodiment of the present invention.

Therefore, according to the polar code coding apparatus provided in this embodiment of the present invention, based on the first mother code length that is corresponding to the to-be-transmitted information bit sequence and that is determined based on the target code length, polar code coding is performed on the information bit sequence by directly using the construction sequence that is corresponding to the information bit sequence and that is determined based on the first mother code length, so as to effectively reduce grading density of the construction sequence in a polar code coding process, and reduce coding overheads.

It should be understood that a representation form of the construction sequence is not limited to the example. For example, the construction sequence may also be in a compression form, relative magnitude of reliability, or in a compression form of relative magnitude of reliability. This is not limited in this embodiment of the present invention.

It should be further understood that, in a process in which the communications device performs polar code coding based on the construction work point, the mapping relationship information may also include a correspondence among the construction work point, the construction sequence, and the transport block size. The mapping relationship information in various embodiments of the present invention may be combined, or may be separated. This is not limited in this embodiment of the present invention.

Therefore, the apparatus for polar code coding provided in this embodiment of the present invention may directly perform polar code coding on the information bit sequence based on at least one of the first transport block size corresponding to the information bit sequence, the first construction work point corresponding to the information bit sequence, or the first construction sequence corresponding to the information bit sequence that are determined based on a mother code length of a polar code, so as to effectively reduce the coding overheads in the polar code coding process.

In an implementation process, each operation of the foregoing method may be completed by using an integrated logical circuit of hardware in the processor or an instruction in a form of software. The operations of the methods disclosed with reference to the embodiments of the present invention may be directly performed and completed by using a hardware processor, or may be performed and completed by using a combination of hardware and software modules in the processor. The software module may be located in a mature storage medium in the field, such as a random access memory, a flash memory, a read-only memory, a programmable read-only memory, an electrically-erasable programmable memory, or a register. The storage medium is located in the memory, and the processor executes the instruction in the memory and completes the operations in the foregoing methods in combination with hardware of the processor. To avoid repetition, details are not described herein.

A person of ordinary skill in the art may be aware that, in combination with the examples described in the embodiments disclosed in this specification, method operations and units may be implemented by electronic hardware, computer software, or a combination thereof. To clearly describe interchangeability between the hardware and the software, the foregoing has generally described operations and compositions of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the embodiments of the present invention.

In addition, the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that in the embodiments of the present invention, "B corresponding to A" indicates that B is associated with A, and B may be determined according to A. However, it should further be understood that determining B according to A does not mean that B is determined according to A only; that is, B may also be determined according to A and/or other information.

It should further be understood that sequence numbers of the foregoing processes do not mean execution sequences in various embodiments of the present invention. The execution sequences of the processes should be determined according to functions and internal logic of the processes, and should not be construed as any limitation on the implementation processes of the embodiments of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present invention.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions in the embodiments of the present invention essentially, or the part contributing to the prior art, or all or a part of the technical solutions may be implemented in the form of a software product. The software product is stored in a storage medium and includes several instructions for instructing a computer device (which may be a personal computer, a server, a network device, or the like) to perform all or a part of the operations of the methods described in the embodiments of the present invention. The foregoing storage medium includes: any medium that can store program code, such as a USB flash drive, a removable hard disk, a read-only memory (ROM), a random access memory (RAM), a magnetic disk, or an optical disc.

It may be understood that, for the brevity and clarity of the application document, technical features and description in an embodiment in the foregoing are applicable to other embodiments, and are no longer described in detail one by one in the other embodiments.

The foregoing descriptions are merely specific embodiments of the embodiments of the present invention, but are not intended to limit the protection scope of the embodiments of the present invention. Any modification or replacement readily figured out by a person skilled in the art within the technical scope disclosed in the embodiments of the present invention shall fall within the protection scope of the embodiments of the present invention. Therefore, the protection scope of the embodiments of the present invention shall be subject to the protection scope of the claims.

What is claimed is:

1. A polar code coding method, comprising:
   determining, based on a target code length corresponding to an information bit sequence, a first mother code length corresponding to the information bit sequence, the target code length being an actual code length cooresponding to the information bit sequence; and
   performing polar code coding on the information bit sequence based on the first mother code length and mapping relationship information, wherein the mapping relationship information comprises a correspondence between the first mother code length and at least one of the following: a transport block size, a construction work point, or a construction sequence.

2. The method according to claim 1, wherein the mapping relationship information comprises a correspondence between the mother code length and the transport block size; and
   the performing of the polar code coding on the information bit sequence based on the first mother code length and the mapping relationship information comprises:
   determining, based on the first mother code length and the mapping relationship information, a first transport block size corresponding to the information bit sequence; and
   performing the polar code coding on the information bit sequence based on the first transport block size.

3. The method according to claim 2, wherein the mapping relationship information comprises a correspondence among a transport block size index, the mother code length, and the transport block size.

4. The method according to claim 1, wherein the mapping relationship information comprises some or all of the following information:

|  | N | | | | | | | | | | |
|---|---|---|---|---|---|---|---|---|---|---|---|
| $I_{TBs}$ | 64 | 128 | 256 | 512 | 1024 | 2048 | 4096 | 8192 | 16384 | 32768 | 65536 |
| 0 | 16 | 20 | 20 | 42 | 82 | 170 | 340 | 600 | 1300 | 4000 | 5500 |
| 1 | 18 | 24 | 26 | 66 | 136 | 200 | 528 | 902 | 2000 | 5000 | 8000 |
| 2 | 19 | 28 | 34 | 84 | 192 | 294 | 715 | 1000 | 2750 | 6000 | 11000 |
| 3 | 20 | 32 | 40 | 100 | 200 | 400 | 900 | 1338 | 3500 | 8000 | 14000 |
| 4 | 22 | 36 | 48 | 130 | 246 | 512 | 1000 | 1774 | 4250 | 9000 | 17000 |
| 5 | 23 | 40 | 56 | 158 | 300 | 600 | 1284 | 2000 | 5000 | 10500 | 20000 |
| 6 | 24 | 46 | 70 | 182 | 354 | 650 | 1460 | 2212 | 5750 | 12000 | 23000 |
| 7 | 26 | 52 | 80 | 206 | 400 | 730 | 1650 | 2648 | 6500 | 13500 | 26000 |
| 8 | 27 | 56 | 90 | 228 | 458 | 840 | 1830 | 3086 | 7250 | 15000 | 29000 |
| 9 | 28 | 60 | 100 | 252 | 504 | 948 | 2000 | 3522 | 8000 | 16500 | 32000 |
| 10 | 30 | 64 | 112 | 276 | 552 | 1000 | 2200 | 3960 | 8750 | 18000 | 35000 |
| 11 | 31 | 70 | 124 | 298 | 598 | 1058 | 2376 | 4000 | 9500 | 19500 | 38000 |
| 12 | 32 | 76 | 138 | 322 | 644 | 1168 | 2594 | 4396 | 10250 | 21000 | 41000 |
| 13 | 34 | 84 | 150 | 346 | 692 | 1276 | 2770 | 4834 | 11000 | 22500 | 44000 |
| 14 | 36 | 92 | 160 | 368 | 738 | 1386 | 2950 | 5270 | 11750 | 24000 | 47000 |
| 15 | 38 | 100 | 172 | 392 | 786 | 1495 | 3140 | 5708 | 12500 | 25500 | 50000 |
| 16 |  |  | 180 | 416 | 832 | 1604 | 3330 | 6000 | 13250 | 27000 | 53000 |
| 17 |  |  | 192 | 438 | 880 | 1714 | 3500 | 6550 | 14000 | 28500 | 56000 |
| 18 |  |  | 206 | 460 | 928 | 1822 | 3686 | 7100 | 14750 | 30000 | 59000 |
| 19 |  |  | 220 | 480 | 972 | 1940 | 3890 | 7650 | 15500 | 31000 | 62000 | wherein N is the mother code length, $I_{TBS}$ is the transport block size index, and a value corresponding to a combination of $I_{TBS}$ and N is the transport block size (TBS).

5. The method according to claim 1, wherein the mapping relationship information comprises a correspondence between the mother code length and the construction work point; and
   the performing of the polar code coding on the information bit sequence based on the first mother code length and the mapping relationship information comprises:
   determining, based on the first mother code length and the mapping relationship information, a first construction work point corresponding to the information bit sequence; and
   performing the polar code coding on the information bit sequence based on the first construction work point.

6. The method according to claim 5, wherein the mapping relationship information comprises a correspondence among a transport block size index, a mother code length, and a construction work point.

7. The method according to claim 5, wherein the mapping relationship information comprises some or all of the following information:

| $I_{TBs}$ | 64 | CSNR | 128 | CSNR | 256 | CSNR | 512 | CSNR | 1024 | CSNR |
|---|---|---|---|---|---|---|---|---|---|---|
| 0 | 16 | 5.377 | 20 | 4.1389 | 20 | 3.6549 | 42 | 2.1699 | 82 | 1.3 |
| 1 | 18 | 5.2084 | 24 | 3.7259 | 26 | 3.2263 | 66 | 1.655 | 136 | 0.9863 |
| 2 | 19 | 5.1599 | 28 | 3.5123 | 34 | 2.7537 | 84 | 1.4834 | 192 | 0.8907 |
| 3 | 20 | 5.0827 | 32 | 3.3621 | 40 | 2.5648 | 100 | 1.4187 | 200 | 0.8897 |
| 4 | 22 | 5.044 | 36 | 3.3061 | 48 | 2.3311 | 130 | 1.3581 | 246 | 0.9346 |
| 5 | 23 | 5.0141 | 40 | 3.2353 | 56 | 2.2119 | 158 | 1.4122 | 300 | 1.001 |
| 6 | 24 | 5.0105 | 46 | 3.1878 | 70 | 2.0803 | 182 | 1.4798 | 354 | 1.078 |
| 7 | 26 | 5.0403 | 52 | 3.1738 | 80 | 2.1721 | 206 | 1.5917 | 400 | 1.1982 |
| 8 | 27 | 5.0689 | 56 | 3.2737 | 90 | 2.1345 | 228 | 1.6957 | 458 | 1.3188 |
| 9 | 28 | 5.086 | 60 | 3.2907 | 100 | 2.1734 | 252 | 1.8289 | 504 | 1.4884 |
| 10 | 30 | 5.1849 | 64 | 3.3993 | 112 | 2.2503 | 276 | 1.971 | 552 | 1.6786 |
| 11 | 31 | 5.2379 | 70 | 3.507 | 124 | 2.3663 | 298 | 2.1607 | 598 | 1.8632 |
| 12 | 32 | 5.2484 | 76 | 3.7313 | 138 | 2.4826 | 322 | 2.3611 | 644 | 2.0591 |
| 13 | 34 | 5.4304 | 84 | 4.079 | 150 | 2.7023 | 346 | 2.6133 | 692 | 2.2783 |
| 14 | 36 | 5.6668 | 92 | 4.609 | 160 | 2.8891 | 368 | 2.8582 | 738 | 2.5767 |
| 15 | 38 | 5.9165 | 100 | 5.4303 | 172 | 3.1032 | 392 | 3.2032 | 786 | 2.8966 |
| 16 | | | | | 180 | 3.2855 | 416 | 3.5998 | 832 | 3.2643 |
| 17 | | | | | 192 | 3.6439 | 438 | 4.0839 | 880 | 3.7595 |
| 18 | | | | | 206 | 4.1581 | 460 | 4.7734 | 928 | 4.4459 |
| 19 | | | | | 220 | 5.0084 | 480 | 5.8749 | 972 | 5.4819 | wherein N is the mother code length, $I_{TBS}$ is the transport block size index, the CSNR indicates the construction work point, and a value corresponding to a combination of $I_{TBS}$ and N is the transport block size TBS.

8. The method according to claim 1, wherein the mapping relationship information comprises a correspondence between the mother code length and the construction sequence; and the performing of the polar code coding on the information bit sequence based on the first mother code length and the mapping relationship information comprises:

determining, based on the first mother code length and the mapping relationship information, a first construction sequence corresponding to the information bit sequence, wherein the first construction sequence is used to indicate a location of an information bit and/or a location of a fixed bit during coding of the information bit sequence; and performing polar code coding on the information bit sequence based on the first construction sequence.

9. The method according to claim 8, wherein the mapping relationship information comprises a correspondence among a transport block size index, the mother code length, and the construction sequence.

10. The method according to claim 8, wherein the construction sequence in the mapping relationship information comprises a first value and a second value, the first value is used to indicate the location of the information bit, and the second value is used to indicate the location of the fixed bit.

11. A polar code coding apparatus, comprising:
at least one memory, configured to store at least one program; and
at least one processor couple to the memory and, configured to execute the at least one program to perform the operations comprising:
determining, based on a target code length corresponding to an information bit sequence, a first mother code length corresponding to the information bit sequence, the target code length being an actual code length corresponding to the information bit sequence; and
performing polar code coding on the information bit sequence based on the first mother code length and mapping relationship information, wherein the mapping relationship information comprises a correspondence between a mother code length and at least one of the following: a transport block size, a construction work point, or a construction sequence.

12. The apparatus according to claim 11, wherein the mapping relationship information comprises a correspondence between the mother code length and the transport block size and the processor is further configured to:
determine, based on the first mother code length and the mapping relationship information, a first transport block size corresponding to the information bit sequence; and
perform polar code coding on the information bit sequence based on the first transport block size.

13. The apparatus according to claim 12, wherein the mapping relationship information comprises a correspondence among a transport block size index, the mother code length, and the transport block size.

14. The apparatus according to claim 11, wherein the mapping relationship information comprises some or all of the following information:

| | N | | | | | | | | | | |
|---|---|---|---|---|---|---|---|---|---|---|---|
| $I_{TBs}$ | 64 | 128 | 256 | 512 | 1024 | 2048 | 4096 | 8192 | 16384 | 32768 | 65536 |
| 0 | 16 | 20 | 20 | 42 | 82 | 170 | 340 | 600 | 1300 | 4000 | 5500 |
| 1 | 18 | 24 | 26 | 66 | 136 | 200 | 528 | 902 | 2000 | 5000 | 8000 |
| 2 | 19 | 28 | 34 | 84 | 192 | 294 | 715 | 1000 | 2750 | 6000 | 11000 |
| 3 | 20 | 32 | 40 | 100 | 200 | 400 | 900 | 1338 | 3500 | 8000 | 14000 |
| 4 | 22 | 36 | 48 | 130 | 246 | 512 | 1000 | 1774 | 4250 | 9000 | 17000 |
| 5 | 23 | 40 | 56 | 158 | 300 | 600 | 1284 | 2000 | 5000 | 10500 | 20000 |
| 6 | 24 | 46 | 70 | 182 | 354 | 650 | 1460 | 2212 | 5750 | 12000 | 23000 |
| 7 | 26 | 52 | 80 | 206 | 400 | 730 | 1650 | 2648 | 6500 | 13500 | 26000 |

-continued

| | | | | | N | | | | | |
|---|---|---|---|---|---|---|---|---|---|---|
| $I_{TBs}$ | 64 | 128 | 256 | 512 | 1024 | 2048 | 4096 | 8192 | 16384 | 32768 | 65536 |
| 8 | 27 | 56 | 90 | 228 | 458 | 840 | 1830 | 3086 | 7250 | 15000 | 29000 |
| 9 | 28 | 60 | 100 | 252 | 504 | 948 | 2000 | 3522 | 8000 | 16500 | 32000 |
| 10 | 30 | 64 | 112 | 276 | 552 | 1000 | 2200 | 3960 | 8750 | 18000 | 35000 |
| 11 | 31 | 70 | 124 | 298 | 598 | 1058 | 2376 | 4000 | 9500 | 19500 | 38000 |
| 12 | 32 | 76 | 138 | 322 | 644 | 1168 | 2594 | 4396 | 10250 | 21000 | 41000 |
| 13 | 34 | 84 | 150 | 346 | 692 | 1276 | 2770 | 4834 | 11000 | 22500 | 44000 |
| 14 | 36 | 92 | 160 | 368 | 738 | 1386 | 2950 | 5270 | 11750 | 24000 | 47000 |
| 15 | 38 | 100 | 172 | 392 | 786 | 1495 | 3140 | 5708 | 12500 | 25500 | 50000 |
| 16 | | | 180 | 416 | 832 | 1604 | 3330 | 6000 | 13250 | 27000 | 53000 |
| 17 | | | 192 | 438 | 880 | 1714 | 3500 | 6550 | 14000 | 28500 | 56000 |
| 18 | | | 206 | 460 | 928 | 1822 | 3686 | 7100 | 14750 | 30000 | 59000 |
| 19 | | | 220 | 480 | 972 | 1940 | 3890 | 7650 | 15500 | 31000 | 62000 | wherein N is the mother code length, $I_{TBS}$ is the transport block size index, and a value corresponding to a combination of $I_{TBS}$ and N is the transport block size TBS.

15. The apparatus according to claim 11, wherein the mapping relationship information comprises a correspondence between the mother code length and the construction work point and the processor is further configured to:
determine, based on the first mother code length and the mapping relationship information, a first construction work point corresponding to the information bit sequence; and
perform polar code coding on the information bit sequence based on the first construction work point.

16. The apparatus according to claim 15, wherein the mapping relationship information comprises a correspondence among a transport block size index, a mother code length, and a construction work point.

17. The apparatus according to claim 15, wherein the mapping relationship information comprises some or all of the following information:

18. The apparatus according to claim 11, wherein the mapping relationship information comprises a correspondence between the mother code length and the construction sequence and a coding unit is configured to:
determine, based on the first mother code length and the mapping relationship information, a first construction sequence corresponding to the information bit sequence, wherein the first construction sequence is used to indicate a location of an information bit and/or a location of a fixed bit during coding of the information bit sequence; and
perform polar code coding on the information bit sequence based on the first construction sequence.

19. The apparatus according to claim 18, wherein the mapping relationship information comprises a correspondence among a transport block size index, the mother code length, and the construction sequence.

20. The apparatus according to claim 18, wherein the construction sequence in the mapping relationship information comprises a first value and a second value, the first value

| | | | | | | N | | | | |
|---|---|---|---|---|---|---|---|---|---|---|
| $I_{TBs}$ | 64 | CSNR | 128 | CSNR | 256 | CSNR | 512 | CSNR | 1024 | CSNR |
| 0 | 16 | 5.377 | 20 | 4.1389 | 20 | 3.6549 | 42 | 2.1699 | 82 | 1.3 |
| 1 | 18 | 5.2084 | 24 | 3.7259 | 26 | 3.2263 | 66 | 1.655 | 136 | 0.9863 |
| 2 | 19 | 5.1599 | 28 | 3.5123 | 34 | 2.7537 | 84 | 1.4834 | 192 | 0.8907 |
| 3 | 20 | 5.0827 | 32 | 3.3621 | 40 | 2.5648 | 100 | 1.4187 | 200 | 0.8897 |
| 4 | 22 | 5.044 | 36 | 3.3061 | 48 | 2.3311 | 130 | 1.3581 | 246 | 0.9346 |
| 5 | 23 | 5.0141 | 40 | 3.2353 | 56 | 2.2119 | 158 | 1.4122 | 300 | 1.001 |
| 6 | 24 | 5.0105 | 46 | 3.1878 | 70 | 2.0803 | 182 | 1.4798 | 354 | 1.078 |
| 7 | 26 | 5.0403 | 52 | 3.1738 | 80 | 2.1721 | 206 | 1.5917 | 400 | 1.1982 |
| 8 | 27 | 5.0689 | 56 | 3.2737 | 90 | 2.1345 | 228 | 1.6957 | 458 | 1.3188 |
| 9 | 28 | 5.086 | 60 | 3.2907 | 100 | 2.1734 | 252 | 1.8289 | 504 | 1.4884 |
| 10 | 30 | 5.1849 | 64 | 3.3993 | 112 | 2.2503 | 276 | 1.971 | 552 | 1.6786 |
| 11 | 31 | 5.2379 | 70 | 3.507 | 124 | 2.3663 | 298 | 2.1607 | 598 | 1.8632 |
| 12 | 32 | 5.2484 | 76 | 3.7313 | 138 | 2.4826 | 322 | 2.3611 | 644 | 2.0591 |
| 13 | 34 | 5.4304 | 84 | 4.079 | 150 | 2.7023 | 346 | 2.6133 | 692 | 2.2783 |
| 14 | 36 | 5.6668 | 92 | 4.609 | 160 | 2.8891 | 368 | 2.8582 | 738 | 2.5767 |
| 15 | 38 | 5.9165 | 100 | 5.4303 | 172 | 3.1032 | 392 | 3.2032 | 786 | 2.8966 |
| 16 | | | | | 180 | 3.2855 | 416 | 3.5998 | 832 | 3.2643 |
| 17 | | | | | 192 | 3.6439 | 438 | 4.0839 | 880 | 3.7595 |
| 18 | | | | | 206 | 4.1581 | 460 | 4.7734 | 928 | 4.4459 |
| 19 | | | | | 220 | 5.0084 | 480 | 5.8749 | 972 | 5.4819 | wherein N is the mother code length, $I_{TBS}$ is the transport block size index, the CSNR indicates the construction work point, and a value corresponding to a combination of $I_{TBS}$ and N is the transport block size TBS.

is used to indicate the location of the information bit, and the second value is used to indicate the location of the fixed bit.

* * * * *